(12) United States Patent
Shimada et al.

(10) Patent No.: US 11,307,690 B2
(45) Date of Patent: Apr. 19, 2022

(54) ELECTRONIC DEVICE, PROGRAM, AND CONTROL METHOD

(71) Applicant: KYOCERA Corporation, Kyoto (JP)

(72) Inventors: Kenji Shimada, Yokohama (JP); Shigeki Tanabe, Yokohama (JP); Koutaro Yamauchi, Yokohama (JP); Manabu Sakuma, Yokohama (JP); Hideki Morita, Yokohama (JP); Yasuhiro Ueno, Yokohama (JP); Isao Masuike, Machida (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 16/788,658

(22) Filed: Feb. 12, 2020

(65) Prior Publication Data

US 2020/0183524 A1    Jun. 11, 2020

Related U.S. Application Data

(63) Continuation of application No. PCT/JP2018/029132, filed on Aug. 2, 2018.

(30) Foreign Application Priority Data

Aug. 22, 2017   (JP) .............................. JP2017-159499

(51) Int. Cl.
| | |
|---|---|
| *G06F 3/041* | (2006.01) |
| *G06F 3/01* | (2006.01) |
| *G06F 3/0482* | (2013.01) |
| *H03K 17/945* | (2006.01) |
| *H04M 1/72469* | (2021.01) |

(52) U.S. Cl.
CPC ............ *G06F 3/0412* (2013.01); *G06F 3/017* (2013.01); *G06F 3/0482* (2013.01); *H03K 17/945* (2013.01); *H04M 1/72469* (2021.01); *H03K 2017/9455* (2013.01)

(58) Field of Classification Search
None
See application file for complete search history.

(56) References Cited

U.S. PATENT DOCUMENTS

| | | | |
|---|---|---|---|
| 9,013,422 B2 | 4/2015 | Miyaji | |
| 10,037,083 B2 | 7/2018 | Nii | |
| 10,194,124 B2 | 1/2019 | Narikawa et al. | |
| 2013/0076659 A1 | 3/2013 | Miyaji | |
| 2013/0214166 A1* | 8/2013 | Barlow | G01J 5/0025 250/342 |
| 2014/0245234 A1 | 8/2014 | Lee et al. | |

(Continued)

FOREIGN PATENT DOCUMENTS

| | | |
|---|---|---|
| EP | 3 498 064 A1 | 6/2019 |
| JP | 2013-084233 A | 5/2013 |

(Continued)

*Primary Examiner* — Christopher J Kohlman
(74) *Attorney, Agent, or Firm* — Studebaker & Brackett PC

(57) ABSTRACT

Provided are an electronic device, a program, and a control method capable of improving detection accuracy. An electronic device includes a proximity sensor, a ranging sensor, and a controller configured to switch a sensor to be operated between the proximity sensor and the ranging sensor in accordance with the distance between an object to be detected and the electronic device.

15 Claims, 11 Drawing Sheets

(56) References Cited

U.S. PATENT DOCUMENTS

| | | | |
|---|---|---|---|
| 2014/0267025 A1* | 9/2014 | Kim | G06F 3/017 345/156 |
| 2014/0340343 A1* | 11/2014 | Han | G06F 3/041 345/173 |
| 2015/0074593 A1* | 3/2015 | Lo | G06F 3/0485 715/784 |
| 2015/0346831 A1 | 12/2015 | Nii | |
| 2016/0309127 A1 | 10/2016 | Narikawa et al. | |
| 2017/0013925 A1* | 1/2017 | Fathollahi | A45C 13/02 |
| 2019/0121443 A1 | 4/2019 | Lee et al. | |

FOREIGN PATENT DOCUMENTS

| | | |
|---|---|---|
| JP | 2015-225493 A | 12/2015 |
| JP | 2016-511471 A | 4/2016 |
| JP | 2018-027026 A | 2/2018 |
| WO | 2015/092905 A1 | 6/2015 |

* cited by examiner

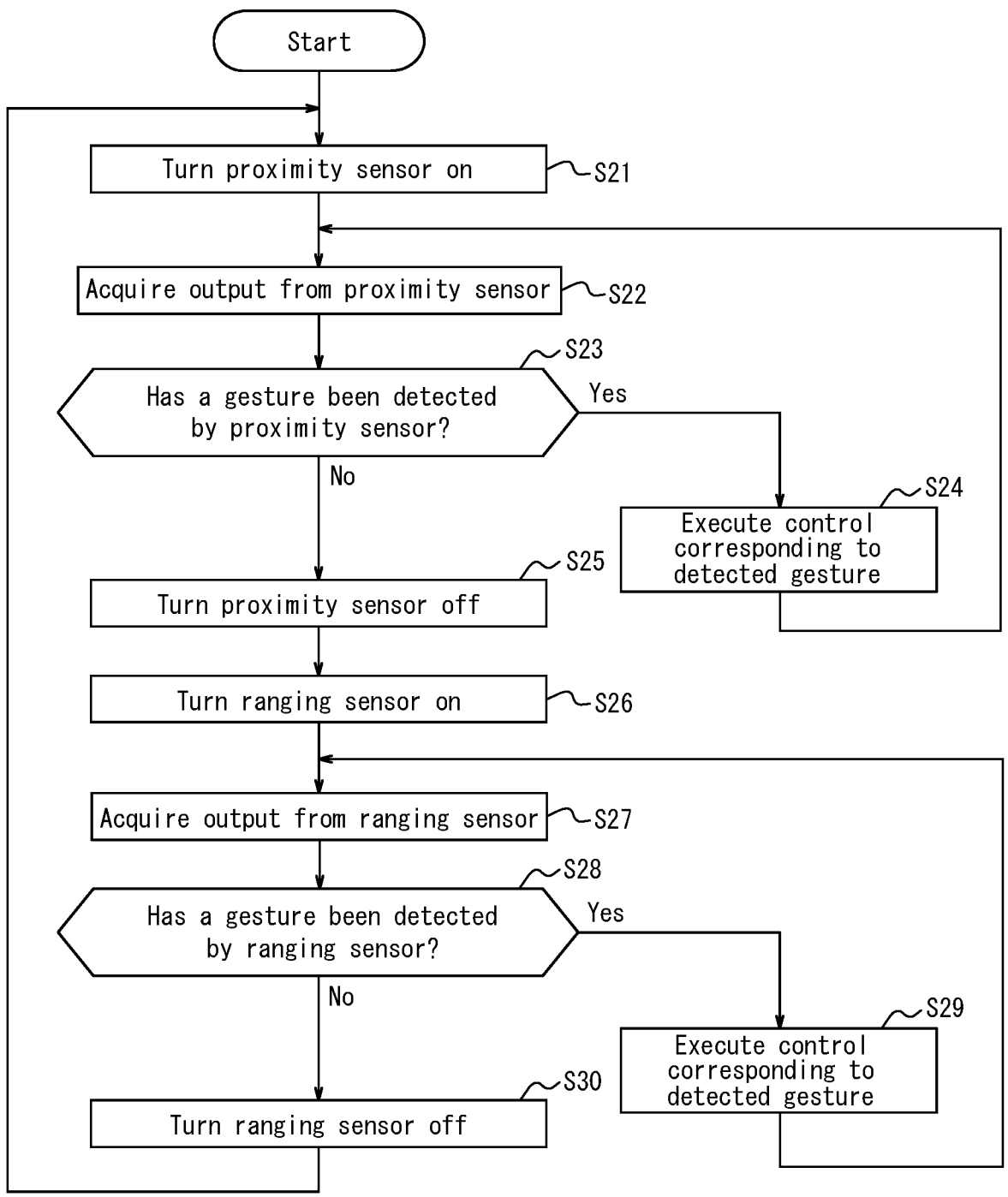

ELECTRONIC DEVICE, PROGRAM, AND CONTROL METHOD

CROSS-REFERENCE TO RELATED APPLICATION

The present application claims priority to and the benefit of Japanese Patent Application No. 2017-159499 filed Aug. 22, 2017, the entire contents of which are incorporated herein by reference.

TECHNICAL FIELD

The present disclosure relates to an electronic device, a program, and a control method.

BACKGROUND

Electronic devices, such as smartphones and tablets, typically include a touch panel. A user typically controls such an electronic device by touching the touch panel. An electronic device that, for example, detects a gesture, performed by the user at a distance from the terminal, using a proximity sensor such as an infrared sensor and then processes an input operation corresponding to the gesture is known. For example, see patent literature (PTL) 1. The electronic device disclosed in PTL 1 detects a gesture with a proximity sensor such as an infrared sensor.

CITATION LIST

Patent Literature

PTL 1: JP2015-225493A

SUMMARY

Technical Problem

The present disclosure provides an electronic device, a program, and a control method capable of improving detection accuracy of input operations.

Solution to Problem

An electronic device according to an embodiment includes a proximity sensor, a ranging sensor, and a controller. The controller is configured to switch the sensor to be operated between the proximity sensor and the ranging sensor in accordance with the distance between an object to be detected and the electronic device.

An electronic device according to an embodiment includes a proximity sensor, a ranging sensor, and a controller. The controller is configured to detect a gesture based on output of the proximity sensor and the ranging sensor.

A program according to an embodiment is for an electronic device that includes a proximity sensor, a ranging sensor, and a controller. The program causes the electronic device to switch, using the controller, the sensor to be operated between the proximity sensor and the ranging sensor in accordance with the distance between an object to be detected and the electronic device.

A program according to an embodiment is for an electronic device that includes a proximity sensor, a ranging sensor, and a controller. The program causes the electronic device to detect, using the controller, a gesture based on output of the proximity sensor and the ranging sensor.

A control method according to an embodiment is for an electronic device that includes a proximity sensor, a ranging sensor, and a controller. The control method includes switching, using the controller, the sensor to be operated between the proximity sensor and the ranging sensor in accordance with the distance between an object to be detected and the electronic device.

A control method according to an embodiment is for an electronic device that includes a proximity sensor, a ranging sensor, and a controller. The control method includes detecting, using the controller, a gesture based on output of the proximity sensor and the ranging sensor.

Advantageous Effect

Embodiments of the present disclosure provide an electronic device, a program, and a control method capable of improving detection accuracy.

BRIEF DESCRIPTION OF THE DRAWINGS

In the accompanying drawings:

FIG. 13 is a flowchart illustrating an example of processing due to control executed by a controller of an electronic device.

DETAILED DESCRIPTION

In an electronic device related to the present disclosure, an infrared sensor may detect the gesture by measuring the amount of reflected light from an object onto which infrared light is emitted. If an obstacle, such as a protective sheet protecting the surface of the electronic device, is located in front of the infrared sensor, then the infrared sensor might detect reflected light from the obstacle. If the infrared sensor detects reflected light from the obstacle, gestures might no longer be detected accurately. Infrared light reflected by the obstacle might also make it difficult for the electronic device to detect gestures at a position away from the electronic device. An electronic device, program, and control method capable of increasing detection accuracy are disclosed below.

(Electronic Device Configuration)

Figure 1:
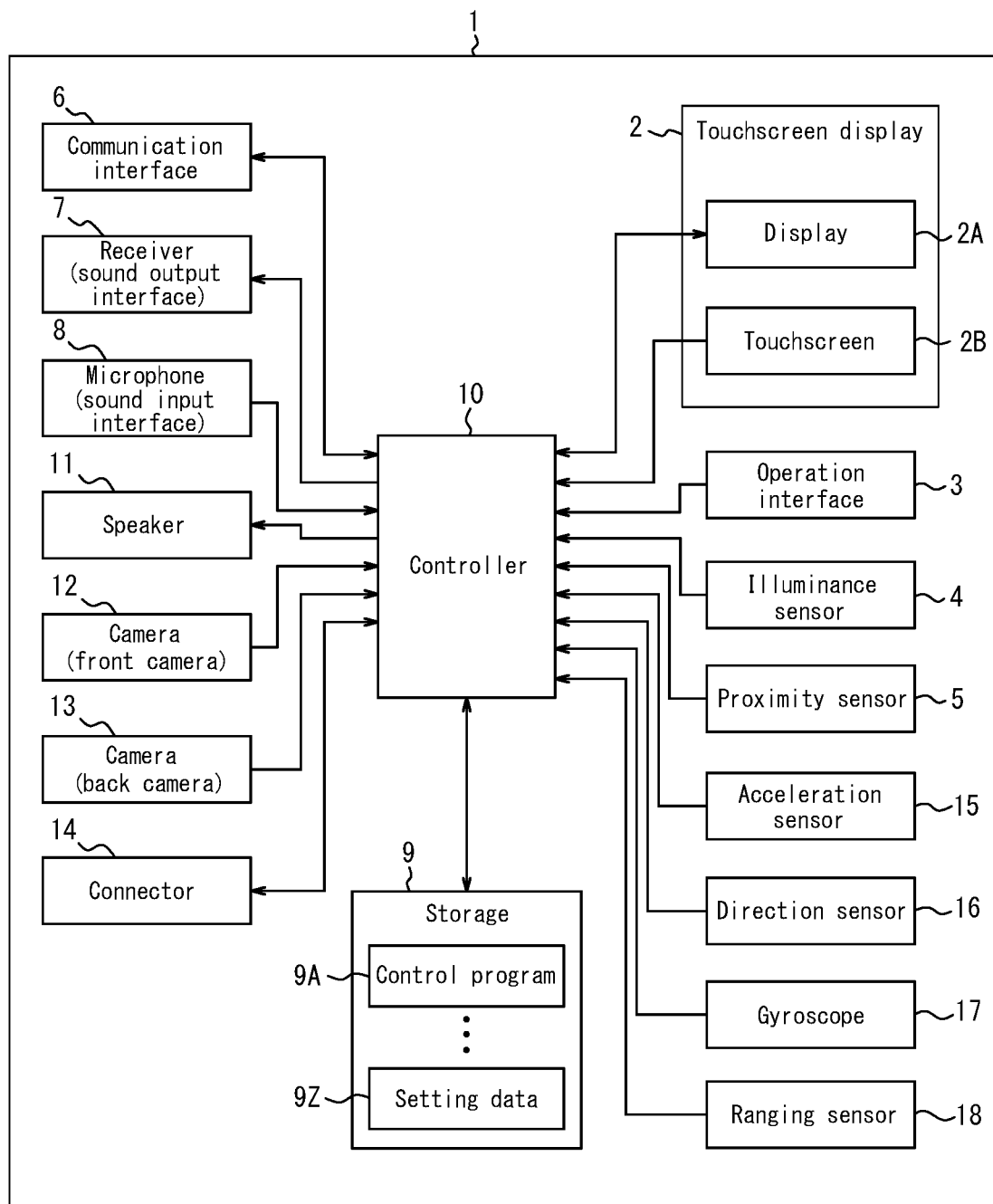
FIG. 1 is a functional block diagram illustrating an example of the schematic configuration of an electronic device according to an embodiment.

An electronic device 1 of an embodiment, illustrated in FIG. 1, includes a touchscreen display 2, an operation interface 3, an illuminance sensor 4, a proximity sensor 5, a communication interface 6, a receiver 7, a microphone 8, a storage 9, a controller 10, a speaker 11, cameras 12, 13, a connector 14, an acceleration sensor 15, a direction sensor 16, a gyroscope 17, and a ranging sensor 18. FIG. 1 is only an example, and the electronic device 1 need not include all of the components in FIG. 1. The electronic device 1 may also include components other than those illustrated in FIG. 1.

The touchscreen display 2 includes a display 2A and a touchscreen 2B. The display 2A and the touchscreen 2B may, for example, overlap, be positioned side-by-side, or be separated. The display 2A and the touchscreen 2B may, for example, be positioned in overlap so that one or more sides of the display 2A is not parallel with any of the sides of the touchscreen 2B.

The display 2A includes a display device such as a liquid crystal display (LCD), an organic electro-luminescence display (OELD), an inorganic electro-luminescence display (IELD), or the like. The display 2A displays objects such as letters, images, symbols, and graphics on the screen. The screen that includes objects such as letters, images, symbols, and graphics displayed by the display 2A includes a screen called a lock screen, a screen called a home screen, and an application screen displayed during execution of an application. The lock screen is a screen displayed when use of at least a portion of functions of the electronic device 1 is restricted. In other words, the electronic device 1 can be in a state in which use of some functions is restricted and a state in which use of functions is not restricted. The home screen is also called a desktop, standby screen, idle screen, standard screen, application list screen, or launcher screen. The display 2A is an example of a display.

The touchscreen 2B detects contact or the like on the touchscreen 2B by a finger, pen, stylus pen, or the like. The touchscreen 2B can detect the position at which the touchscreen 2B is contacted or the like by a plurality of fingers, pens, stylus pens, or the like. The touchscreen 2B notifies the controller 10 of contact or the like on the touchscreen 2B by a finger, along with the position at which contact or the like was detected. The touchscreen 2B may notify the controller 10 of detection of contact or the like by notifying the controller 10 of the detection position. The touchscreen display 2 that includes the touchscreen 2B can execute the operations performable by the touchscreen 2B. In other words, the touchscreen display 2 may perform the operations performed by the touchscreen 2B.

The controller 10 judges the type of input operation on the basis of at least one of contact or the like detected by the touchscreen 2B, the position of the detected contact or the like, the duration of the contact or the like, the interval between detections of contact, and the number of times contact or the like is detected. The electronic device 1 that includes the controller 10 can execute the operations performable by the controller 10. In other words, the electronic device 1 may perform the operations performed by the controller 10. The input operation is an operation on the touchscreen 2B. Input operations that can be judged by the controller 10 include, but are not limited to, a touch, a long touch, a release, a swipe, a tap, a double tap, a long tap, a drag, a flick, a pinch-in, and a pinch-out, for example.

Any detection system may be used in the touchscreen 2B, such as a capacitive system, a resistive film system, a surface acoustic wave system (or an ultrasonic wave system), an infrared system, an electromagnetic induction system, or a load detection system.

The operation interface 3 is an operation button operated by the user. The operation interface 3 is disposed in a housing of the electronic device 1 so as to be pressable by the user. A plurality of operation interfaces 3 may be provided. The controller 10 cooperates with the operation interface 3 to detect operations on the operation interface 3. The operations on the operation interface 3 include, but are not limited to, a click, double-click, a triple-click, and a push.

The illuminance sensor 4 detects the illuminance of surrounding light on the electronic device 1. The illuminance is the value of luminous flux incident on a measurement surface of the illuminance sensor 4 per unit area. The illuminance sensor 4 may, for example, be used to adjust the luminance of the display 2A.

Without contact, the proximity sensor 5 detects the relative distance to an object (substance to be detected) near the electronic device 1, the movement direction of the object, and the like. In the present embodiment, the proximity sensor 5 includes one infrared light emitting diode (LED) acting as a light source and four infrared photodiodes. The proximity sensor 5 emits infrared light, from the infrared LED acting as a light source, towards an object. Reflected light from the object is incident on the infrared photodiodes of the proximity sensor 5. The proximity sensor 5 can measure the relative distance to the object on the basis of the output current of the infrared photodiodes. The proximity sensor 5 also detects the movement direction of the object by the difference in time at which reflected light from the object is incident on each of the infrared photodiodes. The proximity sensor 5 can thus detect an operation by an air gesture (gesture) that the user of the electronic device 1 performs without touching the electronic device 1. The proximity sensor 5 may include visible light photodiodes. In the present embodiment, the proximity sensor 5 may be provided on the same surface of the electronic device 1 as the touchscreen display 2.

Figure 2:
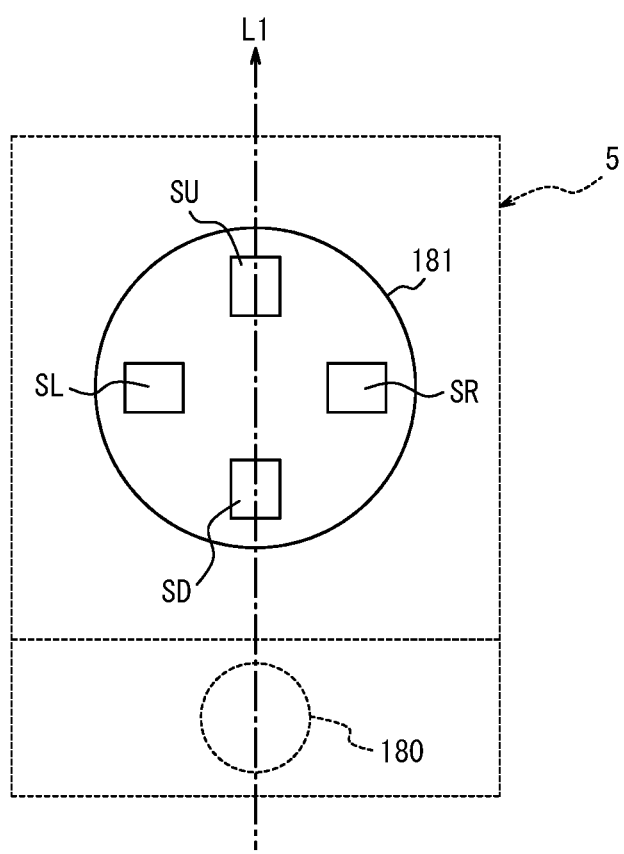
FIG. 2 is a configuration diagram of a proximity sensor.
Figure 3:
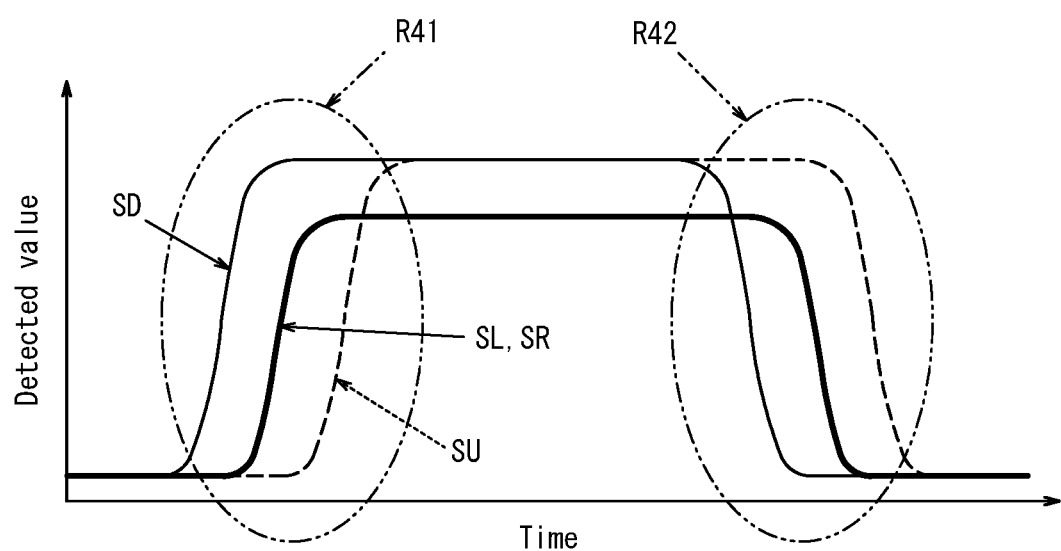
FIG. 3 illustrates the change over time in the value detected by each infrared photodiode.

A method performed by the controller 10 to detect a gesture by the user on the basis of output of the proximity sensor 5 is described below in detail with reference to FIGS. 2 and 3. FIG. 2 illustrates an example configuration of the proximity sensor 5 when the electronic device 1 is viewed from the front. The proximity sensor 5 includes an infrared LED 180 used as a light source and four infrared photodiodes SU, SR, SD, and SL. The four infrared photodiodes SU, SR, SD, and SL detect reflected light from a detection target through a lens 181. The four infrared photodiodes SU, SR, SD, and SL are arranged symmetrically around the center of the lens 181. An imaginary line L1 illustrated in FIG. 2 is substantially parallel to the longitudinal direction of the electronic device 1. The infrared photodiode SU and the infrared photodiode SD are located apart on the imaginary line L1 in FIG. 2. The infrared photodiodes SR and SL are located between the infrared photodiode SU and the infrared photodiode SD in the direction of the imaginary line L1 in FIG. 2.

Figure 4:
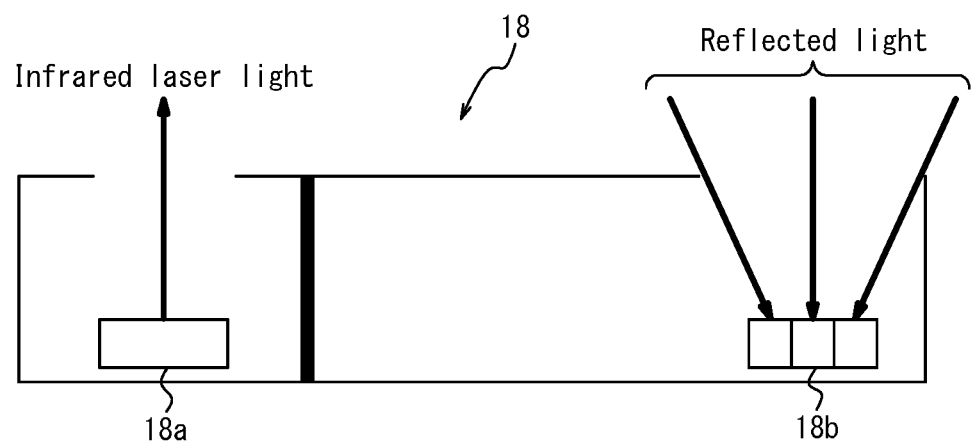
FIG. 4 schematically illustrates a ranging sensor.

FIG. 4 illustrates the change over time in the value detected by the four infrared photodiodes SU, SR, SD, and SL as the detection target (for example, the user's hand) moves in the direction of the imaginary line L1 in FIG. 2. The infrared photodiode SU and the infrared photodiode SD are separated the most in the direction of the imaginary line L1. Hence, as illustrated in FIG. 3, the time difference is greatest between the change (for example, increase) in the value detected by the infrared photodiode SU (dashed line) and the same change (for example, increase) in the value detected by the infrared photodiode SD (thin, solid line). By recognizing a predetermined time difference in the change in the values detected by the infrared photodiodes SU, SR, SD, and SL, the controller 10 can judge the movement direction of the detection target.

The controller 10 acquires the values detected by the infrared photodiodes SU, SR, SD, and SL from the proximity sensor 5. To recognize movement by the detection target in the direction of the imaginary line L1, for example, the controller 10 may integrate the result of subtracting the value detected by the photodiode SU from the value detected by the photodiode SD over a predetermined time. In the example in FIG. 3, the integral value in regions R41 and R42 is non-zero. From the change in the integral value (for example, a positive, zero, or negative change), the controller 10 can recognize movement of the detection target in the direction of the imaginary line L1.

The controller 10 may also integrate the result of subtracting the value detected by the photodiode SR from the value detected by the photodiode SL over a predetermined time. From the change in the integral value (for example, a positive, zero, or negative change), the controller 10 can recognize movement of the detection target in a direction orthogonal to the imaginary line L1 (a direction substantially parallel to the transverse direction of the electronic device 1).

Alternatively, the controller 10 may perform calculations using all of the detected values of the photodiodes SU, SR, SD, and SL. In other words, the controller 10 may recognize the movement direction of the detection target without performing calculations to divide the movement direction into components in the longitudinal direction and the transverse direction of the electronic device 1.

The detected gesture may be a left or right gesture, an up or down gesture, a diagonal gesture, a gesture to trace a circle clockwise, a gesture to trace a circle counterclockwise, or other such gesture. For example, the left or right gesture is performed in a direction substantially parallel to the transverse direction of the electronic device 1. The up or down gesture is performed in a direction substantially parallel to the longitudinal direction of the electronic device 1. The diagonal gesture is performed in a plane substantially parallel to the electronic device 1 in a direction not parallel to either the longitudinal direction or the transverse direction of the electronic device 1.

The case of the proximity sensor 5 including four photodiodes SU, SR, SD, SL has been described. The number of photodiodes included in the proximity sensor 5 is not, however, necessarily four. The number and arrangement of the photodiodes in the proximity sensor 5 may be determined appropriately in accordance with the type of gestures to be detected.

With reference again to FIG. 1, the communication interface 6 communicates wirelessly. The communication method supported by the communication interface 6 is prescribed by a wireless communication standard. For example, a cellular phone communication standard such as 2G, 3G, or 4G may be used as the wireless communication standard. Examples of cellular phone communication standards include long term evolution (LTE), wideband code division multiple access (W-CDMA), CDMA2000, personal digital cellular (PDC), global system for mobile communications (GSM® (GSM is a registered trademark in Japan, other countries, or both)), and personal handy-phone system (PHS). Further examples of wireless communication standards include worldwide interoperability for microwave access (WiMAX), IEEE802.11, Bluetooth® (Bluetooth is a registered trademark in Japan, other countries, or both), infrared data association (IrDA), and near field communication (NFC). The communication interface 6 may support one or more of the aforementioned communication standards.

The receiver 7 and the speaker 11 output audio. The receiver 7 and the speaker 11 output sound signals, transmitted from the controller 10, as sound. The receiver 7 is, for example, used to output the other party's voice during a phone call. The speaker 11 is, for example, used to output a ringtone and music. One of the receiver 7 and the speaker 11 may also serve the functions of the other. The microphone 8 is a sound input interface. The microphone 8 converts the user's speech or the like to a sound signal and transmits the sound signal to the controller 10.

The storage 9 stores programs and data. The storage 9 is also used as a working area to store results of processing by the controller 10 temporarily. The storage 9 may include any non-transitory storage medium, such as a semiconductor storage medium or a magnetic storage medium. The storage 9 may also include a plurality of types of storage media. The storage 9 may include a combination of a portable storage medium, such as a memory card, optical disc, or magneto-optical disc, and an apparatus for reading the storage medium. The storage 9 may include a storage device used as a temporary storage area, such as random access memory (RAM).

The programs stored on the storage 9 include applications that run in the foreground or the background and a control program that supports operations of the applications. The applications may, for example, display a screen on the display 2A and cause the controller 10 to execute processing in accordance with an input operation detected by the touchscreen 2B. The control program includes an operating system (OS), for example. The applications and the control program may be installed on the storage 9 through wireless communication by the communication interface 6 or from a non-transitory storage medium.

The storage 9 stores control program 9A and setting data 9Z, for example. The setting data 9Z includes information related to various settings for operation of the electronic device 1.

The control program 9A provides functions related to various types of control which enable the electronic device 1 to operate. The control program 9A may, for example, place a phone call by controlling components such as the communication interface 6, receiver 7, and microphone 8. The functions provided by the control program 9A include functions for performing various types of control, such as changing information displayed on the display 2A in accordance with input operations detected via the touchscreen 2B. The control program 9A detects a gesture performed by the user without contact and provides various control-related functions based on the detected gesture. The gesture is detected based on output from the proximity sensor 5 and/or output from the ranging sensor 18. The functions provided by the control program 9A may be used in combination with functions provided by other programs.

The controller 10 is an arithmetic processing unit. Examples of the arithmetic processing unit include, but are not limited to, a central processing unit (CPU), a system-on-a-chip (SOC), a micro control unit (MCU), a field-programmable gate array (FPGA), and a coprocessor. The controller 10 may include a plurality of arithmetic processing units. The controller 10 implements a variety of functions by controlling overall operation of the electronic device 1.

In greater detail, the controller 10 executes commands included in the programs stored in the storage 9 while referring as necessary to data stored in the storage 9. The controller 10 thus controls functional components in accordance with data and instructions, thereby implementing various functions. The functional components include, but are not limited to, the display 2A, communication interface 6, receiver 7, and speaker 11, for example. The controller 10 may change the control in response to detection results from detectors. The detectors include, but are not limited to, the touchscreen 2B, operation interfaces 3, illuminance sensor 4, proximity sensor 5, microphone 8, camera 12, camera 13, acceleration sensor 15, direction sensor 16, gyroscope 17, and ranging sensor 18, for example.

The camera 12 and camera 13 convert a captured image into an electric signal. The camera 12 is a front camera that captures images of an object facing the display 2A. The camera 13 is a back camera that captures images of an object facing the opposite side from the display 2A. The camera 12 and the camera 13 may be mounted in the electronic device 1 in a functionally and physically unified state as a camera unit that allows switching between the front camera and the back camera.

The connector 14 is a terminal to which another apparatus connects. The connector 14 may be a universal terminal such as a universal serial bus (USB) terminal, a high-definition multimedia interface (HDMI® (HDMI is a registered trademark in Japan, other countries, or both)) terminal, Light Peak (Thunderbolt® (Thunderbolt is a registered trademark in Japan, other countries, or both)), or an earphone microphone connector. The connector 14 may be a dedicated terminal, such as a Dock connector. The apparatuses that may connect to the connector 14 include, but are not limited to, an external storage, a speaker, and a communication apparatus, for example.

The acceleration sensor 15 detects the direction and magnitude of acceleration acting on the electronic device 1, the angle of inclination of the electronic device 1, and the magnitude and direction of gravitational acceleration. The direction sensor 16 detects the orientation of the earth's magnetic field. The gyroscope 17 detects the angle and the angular velocity of the electronic device 1. The detection results of the acceleration sensor 15, direction sensor 16, and gyroscope 17 are used in combination to detect changes in the position, orientation, and state of the electronic device 1.

The ranging sensor 18 is a sensor capable of sensing the distance to an object. The ranging sensor 18 is, for example, configured by a time of flight (ToF) sensor. The ranging sensor 18 configured as a ToF sensor includes a light emitter that irradiates sinusoidal modulated light (infrared laser light) towards an object and a light receiver that receives reflected light, from the object, of the irradiated infrared laser light. The light receiver includes an image sensor in which a plurality of light-receiving elements are arranged, for example. The ToF sensor measures the time (time-of-flight) from when infrared laser light is irradiated until reflected light is received by the light-receiving elements. The ToF sensor can measure the time-of-flight based on the phase difference between the irradiated infrared laser light and the received reflected light. Based on the measured time-of-flight, the ToF sensor can measure the distance to the object that reflected the irradiated infrared laser light. The ToF sensor can detect the direction of movement of the object from the time difference between when reflected light from the object is incident on each of the light-receiving elements. With a principle similar to the principle described for the proximity sensor 5, the ToF sensor as well can therefore detect a gesture performed by the user. In the present embodiment, the ranging sensor 18 may be provided on the same surface of the electronic device 1 as the proximity sensor 5. The ranging sensor 18 in the present embodiment is described below as being configured by a ToF sensor.

Figure 6:
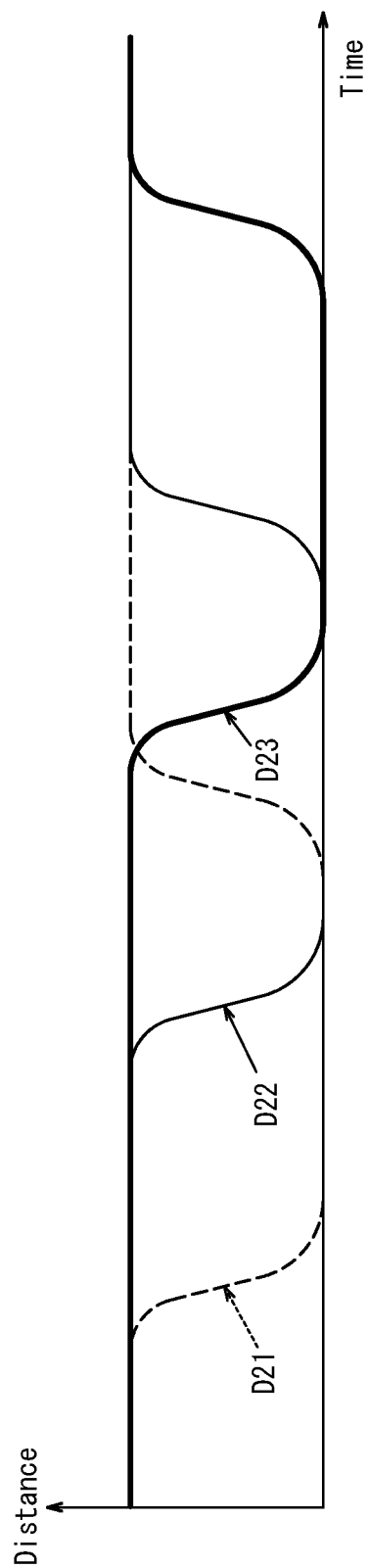
FIG. 6 schematically illustrates the change in distance to an object detected by each light-receiving element.

A method performed by the controller 10 to detect a gesture by the user based on output of the ranging sensor 18 is described below in detail with reference to FIGS. 4 and 6. FIG. 4 schematically illustrates the ranging sensor 18. FIG. 4 is a side view of the ranging sensor 18. The ranging sensor 18 includes a light emitter 18a and a light receiver 18b. The light emitter 18a and the light receiver 18b are arranged to be substantially parallel to the longitudinal direction of the electronic device 1. The light emitter 18a irradiates infrared laser light towards an object. The light receiver 18b receives reflected light, from the object, of the irradiated infrared light.

Figure 5:
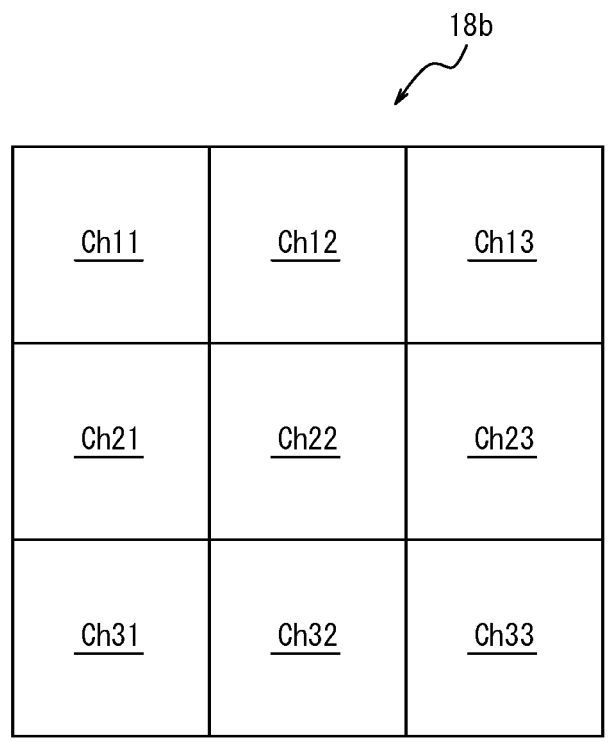
FIG. 5 schematically illustrates an example of arrangement of light-receiving elements in a light receiver.

The light receiver 18b may include a plurality of light-receiving elements. For example, the light receiver 18b may include nine light-receiving elements arranged in a 3×3 grid, as illustrated in FIG. 5. The nine light-receiving elements each receive reflected light from the object. In the light receiver 18b, three light-receiving elements Ch11, Ch12, Ch13 are arranged in order from the left in the upper row in a direction substantially parallel to the transverse direction of the electronic device 1. In the light receiver 18b, three light-receiving elements Ch21, Ch22, Ch23 are arranged in order from the left in the middle row in a direction substantially parallel to the transverse direction of the electronic device 1. In the light receiver 18b, three light-receiving elements Ch31, Ch32, Ch33 are arranged in order from the left in the lower row in a direction substantially parallel to the transverse direction of the electronic device 1.

The ranging sensor 18 can measure the distance to the object from each of the nine light-receiving elements based on the phase difference between the infrared laser light irradiated by the light emitter 18a and the reflected light received by each of the nine light-receiving elements of the light receiver 18b. The ranging sensor 18 can detect a gesture based on the distance from each of the nine light-receiving elements to the object and the change over time in the distance.

For example, suppose that the user performs a gesture to move a hand from left to right. At this time, the distances to the object detected by the light-receiving elements Ch21, Ch22, Ch23 in the middle row are designated as D21, D22, D23. FIG. 6 schematically illustrates the change in distance to the object detected by each light-receiving element. As illustrated schematically in FIG. 6, for example, the hand that is the object first approaches the light-receiving element Ch21 located on the left side. The distance D21 to the object detected by the light-receiving element Ch21 therefore decreases. Subsequently, the hand that is the object approaches the light-receiving element Ch22 located in the middle, and the distance D22 to the object detected by the light-receiving element Ch22 decreases. Finally, the hand that is the object moves to the right, and the distance D23 to the object detected by the light-receiving element Ch23 located on the right side decreases. The order in which the hand that approached the light-receiving elements Ch21, Ch22, Ch23 moves away is also Ch21, Ch22, Ch23. Consequently, the distances D21, D22, D23 increase in this order (and return to their initial values). A gesture in the up or down direction can also be detected by the same principle using the light-receiving elements Ch12, Ch22, Ch32 arranged in the longitudinal direction, for example. The ranging sensor 18 can thus detect a gesture based on the distance from each of the nine light-receiving elements to the object and the change over time in the distance.

The light receiver 18b has been described as including nine light-receiving elements, but the number of light-receiving elements in the light receiver 18b is not limited to this example. The arrangement of the light-receiving elements in FIG. 5 is also not limiting. The number and arrangement of the light-receiving elements in the light receiver 18b may be determined appropriately in accordance with the type of gestures to be detected.

The light emitter 18a of the ranging sensor 18 may include a plurality of light-emitting elements. In this case, the distance to the object from each of the nine light-emitting elements can be measured based on the phase difference between the infrared laser light emitted by each light-emitting element and the reflected light received by the light receiver 18b. By adapting the above-described principle, the ranging sensor 18 can detect a gesture in this case as well based on the distance from each of the nine light-receiving elements to the object and the change over time in the distance.

(Gesture Detection by Known Proximity Sensor)

The electronic device disclosed in PTL 1, for example, detects a gesture with a proximity sensor such as an infrared sensor. The infrared sensor detects a gesture by irradiating infrared light from an infrared irradiation port and measuring the amount of reflected light, from an object, of the irradiated infrared light. The user might, for example, attach a protective sheet on the front of the electronic device, where the touchscreen display is located, to protect the touchscreen display. When the infrared irradiation port of the infrared sensor is located in the electronic device on the same front side as the touchscreen display, then the protective sheet attached to the electronic device also covers the infrared irradiation port. The infrared sensor might detect light reflected by the protective sheet in this case.

Figure 7:
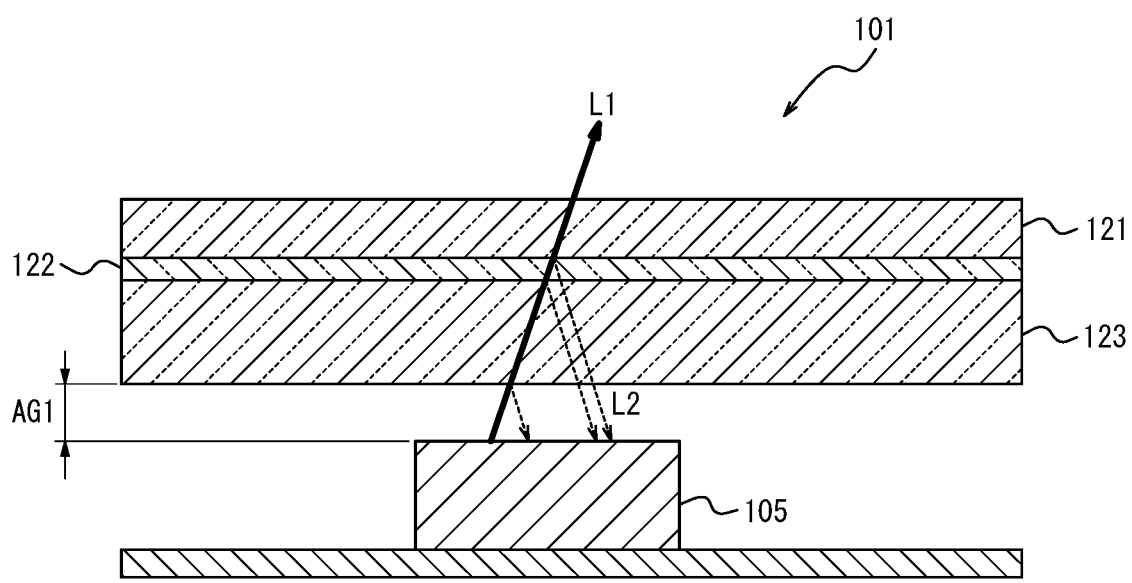
FIG. 7 schematically illustrates detection by a proximity sensor in a known electronic device.

FIG. 7 schematically illustrates detection by a proximity sensor in a known electronic device. FIG. 7 schematically illustrates a cross-section including a proximity sensor 105 in a known electronic device 101, such as the electronic device disclosed in PTL 1. As illustrated in the example in FIG. 7, strengthened glass 123 is disposed in front of the proximity sensor 105 included in the electronic device 101. A protective sheet 121 is adhered to the strengthened glass 123 with an adhesive layer 122 therebetween. An air gap AG1 is present between the proximity sensor 105 and the strengthened glass 123. A portion of infrared light L1 irradiated from the proximity sensor 105 is reflected at the surfaces of the protective sheet 121, adhesive layer 122, and strengthened glass 123 before reaching the object to be detected and is received by the proximity sensor 105 as reflected light L2. The protective sheet 121, adhesive layer 122, and strengthened glass 123 thus affect the transmittance of the infrared light L1 irradiated from the proximity sensor 105.

Figure 8:
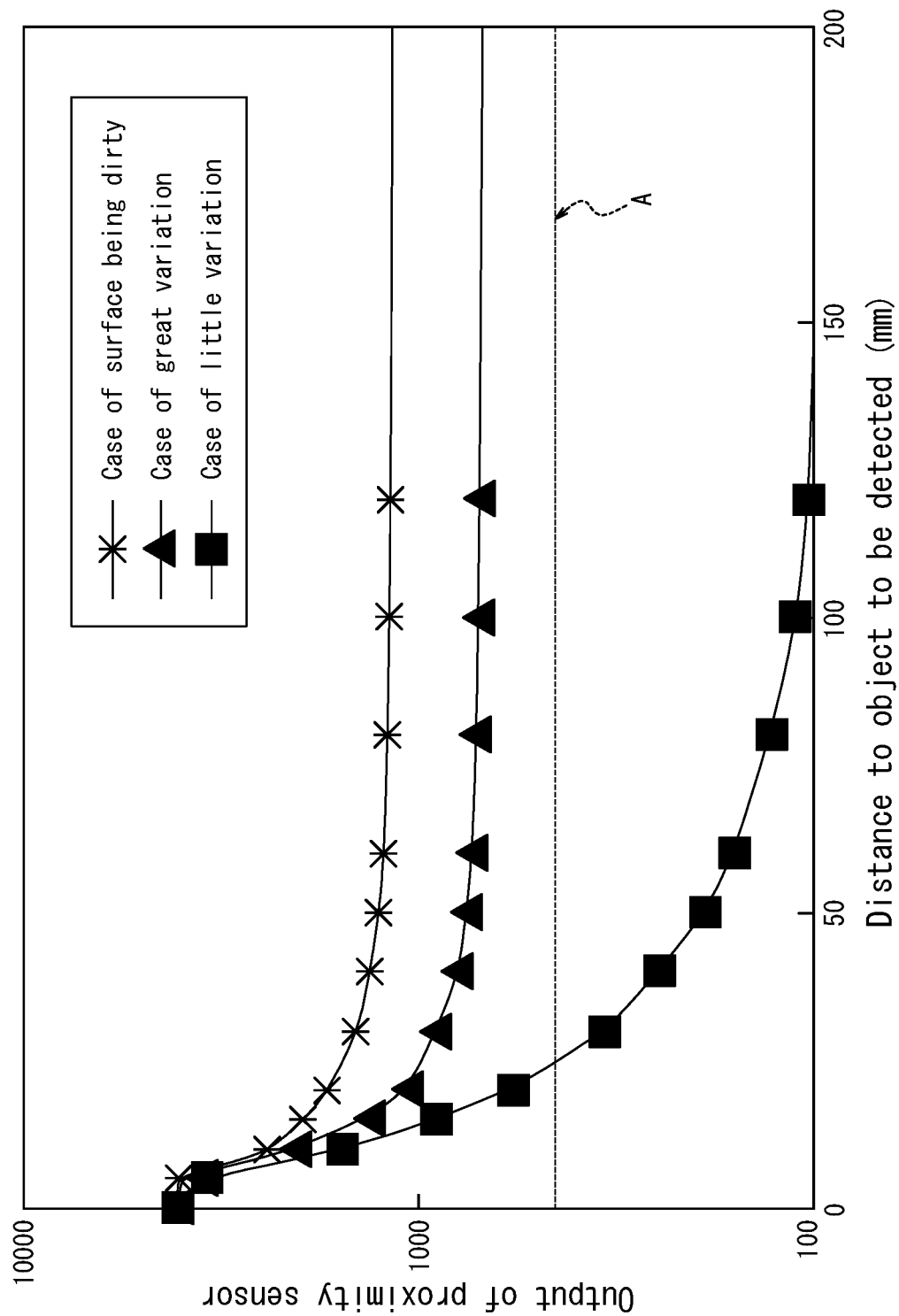
FIG. 8 illustrates the relationship between output of the proximity sensor and detection distance in a known electronic device.

FIG. 8 illustrates the relationship between output of the proximity sensor 105 and detection distance in the known electronic device 101. In the graph in FIG. 8, the horizontal axis indicates the distance between the electronic device 101 and the object to be detected, and the vertical axis indicates the output of the proximity sensor 105, i.e. the detected value of reflected light (crosstalk value). FIG. 8 illustrates the relationship between the detection distance and the output of the proximity sensor 105 for three cases: adhesion of the protective sheet 121 exhibiting little variation, adhesion of the protective sheet 121 exhibiting great variation, and the surface of the protective sheet 121 being dirty. Variation in the adhesion refers to factors that can reflect infrared light in the electronic device 1 that has the protective sheet 121 adhered to the strengthened glass 123, such as the thickness of the adhesive layer 122, wrinkles in the protective sheet 121, and dirt on the adhesive layer 122. As illustrated in FIG. 8, reflection at the protective sheet 121 tends to occur more when the protective sheet 121 has large unevenness than when the protective sheet 121 has little unevenness. The output of the proximity sensor 105 consequently remains high, even when the object to be detected is far away. A larger component is reflected by the protective sheet 121 when the surface of the protective sheet 121 is dirty, and the output of the proximity sensor 105 increases further.

In FIG. 8, the line A is a threshold for judging whether an object is detected. The electronic device 101 judges that an object is detected when the output of the proximity sensor 105 exceeds the threshold A. In the electronic device 101, the threshold A needs to be decreased to detect objects that are farther away. If the threshold A is decreased excessively, however, the adhesive state of the protective sheet 121 results in the output of the proximity sensor 105 always exceeding the threshold A due to reflection by the protective sheet 121 and the like, as illustrated in FIG. 8, for example. Therefore, the electronic device 101 continually judges that an object is detected. Object detection cannot be considered correct, however, since the proximity sensor 105 is merely detecting reflected light from the protective sheet 121.

An electronic device 1 according to an embodiment of the present disclosure addresses this issue by detecting an object using the proximity sensor 5 and the ranging sensor 18. The electronic device 1 thereby facilitates appropriate detection at a greater distance.

(Gesture-Based Operation of Electronic Device)

Figure 9:
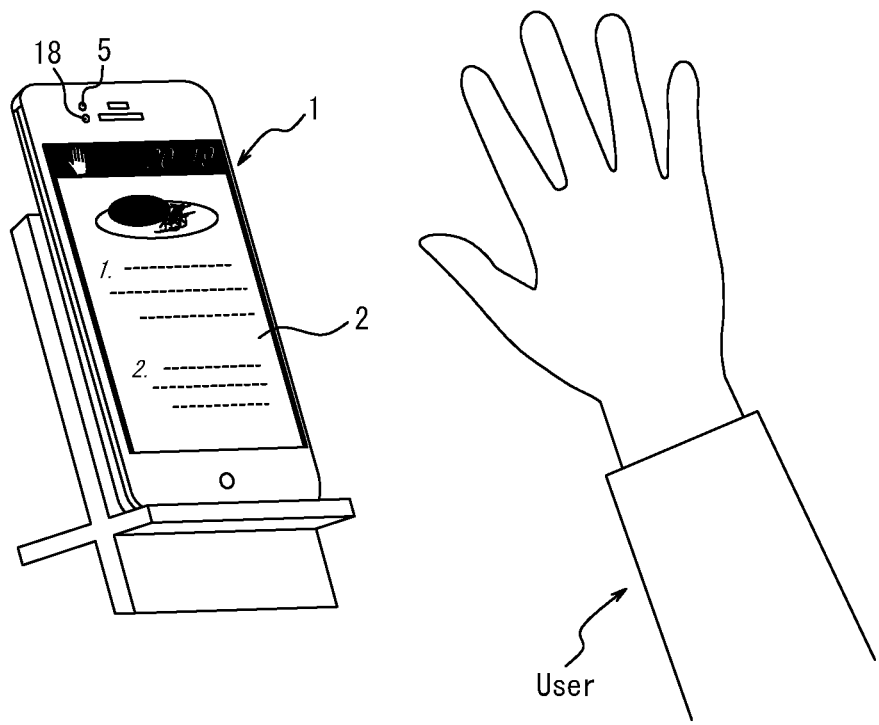
FIG. 9 illustrates a user operating an electronic device with a gesture.

FIG. 9 illustrates the user operating the electronic device 1 with a gesture. In FIG. 9, the electronic device 1 is supported by a stand as an example. Alternatively, the electronic device 1 may be leaned against a wall or placed on a table. Upon the proximity sensor 5 or the ranging sensor 18 detecting a gesture by the user, the controller 10 executes processing based on the detected gesture. In the example in FIG. 9, the processing in response to the gesture is scrolling of the screen displaying a recipe. For example, when the user makes a gesture by moving a hand upward in the longitudinal direction of the electronic device 1, the screen scrolls upward in accordance with the movement of the user's hand. When the user makes a gesture by moving a hand downward in the longitudinal direction of the electronic device 1, the screen scrolls downward in accordance with the movement of the user's hand.

The electronic device 1 in FIG. 9 is a smartphone. Alternatively, the electronic device 1 may, for example, be a mobile phone, a phablet, a tablet PC, a feature phone, or other such device. The electronic device 1 is not limited to these examples and may, for example, also be a personal digital assistant (PDA), a remote control, a portable music player, a game device, an electronic book reader, a car navigation device, a household appliance, an industrial device (factory automation (FA) device), or the like.

(Kitchen Mode)

Figure 10:
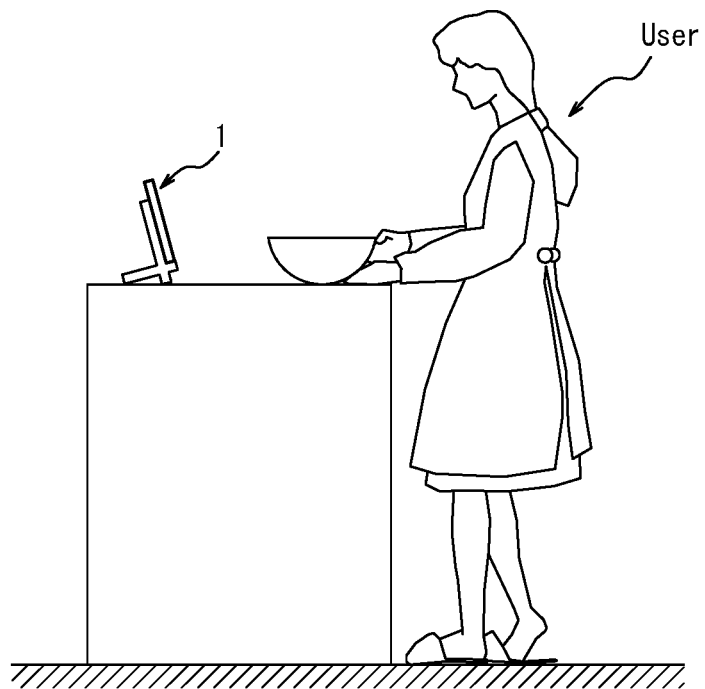
FIG. 10 illustrates an example of conditions in which an electronic device is operated with a gesture.

FIG. 10 illustrates example conditions in which the user operates the electronic device 1 with a gesture. In the example in FIG. 10, the user is cooking in the kitchen by following a cooking recipe displayed on the touchscreen display 2 of the electronic device 1. At this time, the proximity sensor 5 and/or ranging sensor 18 detects a gesture by the user. The controller 10 executes processing based on the gesture detected by the proximity sensor 5 and/or ranging sensor 18. For example, the controller 10 can execute processing to scroll the recipe in response to a particular gesture (such as the user moving the hand up or down). The user's hand may become dirty or wet during cooking. The user can scroll the recipe, however, without touching the electronic device 1. The touchscreen display 2 therefore does not become dirty, and dirt on the touchscreen display 2 can be prevented from getting on the user's hand during cooking.

The electronic device 1 has a plurality of modes. Modes refer to operation modes (operating states or operation statuses) that, for example, place restrictions on the operations of the entire electronic device 1. For example, when a particular application is launched, the electronic device 1 enters an operation mode corresponding to the application. A configuration allowing selection of only one mode at a time may be adopted. In the present embodiment, the modes of the electronic device 1 include a first mode and a second mode.

The first mode is a regular operation mode (regular mode) appropriate for use in rooms other than the kitchen or outside of the home, for example. In the first mode, the user can access functions executable by the electronic device 1. The user can access a camera function, a calling function, an e-mail function, and the like of the electronic device 1 in the first mode, for example. In the first mode, the user can also launch an application installed on the electronic device 1.

The second mode is an operation mode (kitchen mode) of the electronic device 1 that is optimal for cooking in the kitchen while a recipe is displayed. The user can transition the electronic device 1 to the second mode by, for example, launching a particular application on the electronic device 1. The particular application referred to here may, for example, be an application to display a recipe. As described above, input operations can preferably be made by gestures in the second mode. In other words, when the mode of the electronic device 1 switches to the second mode, the proximity sensor 5 and/or ranging sensor 18 preferably operates in accordance with the switching to allow detection of a gesture. By including the below-described user interface, the electronic device 1 of the present embodiment can operate the proximity sensor 5 and/or ranging sensor 18 in conjunction with switching to the second mode (kitchen mode).

(Characteristics of Proximity Sensor and Ranging Sensor)

Figure 11:
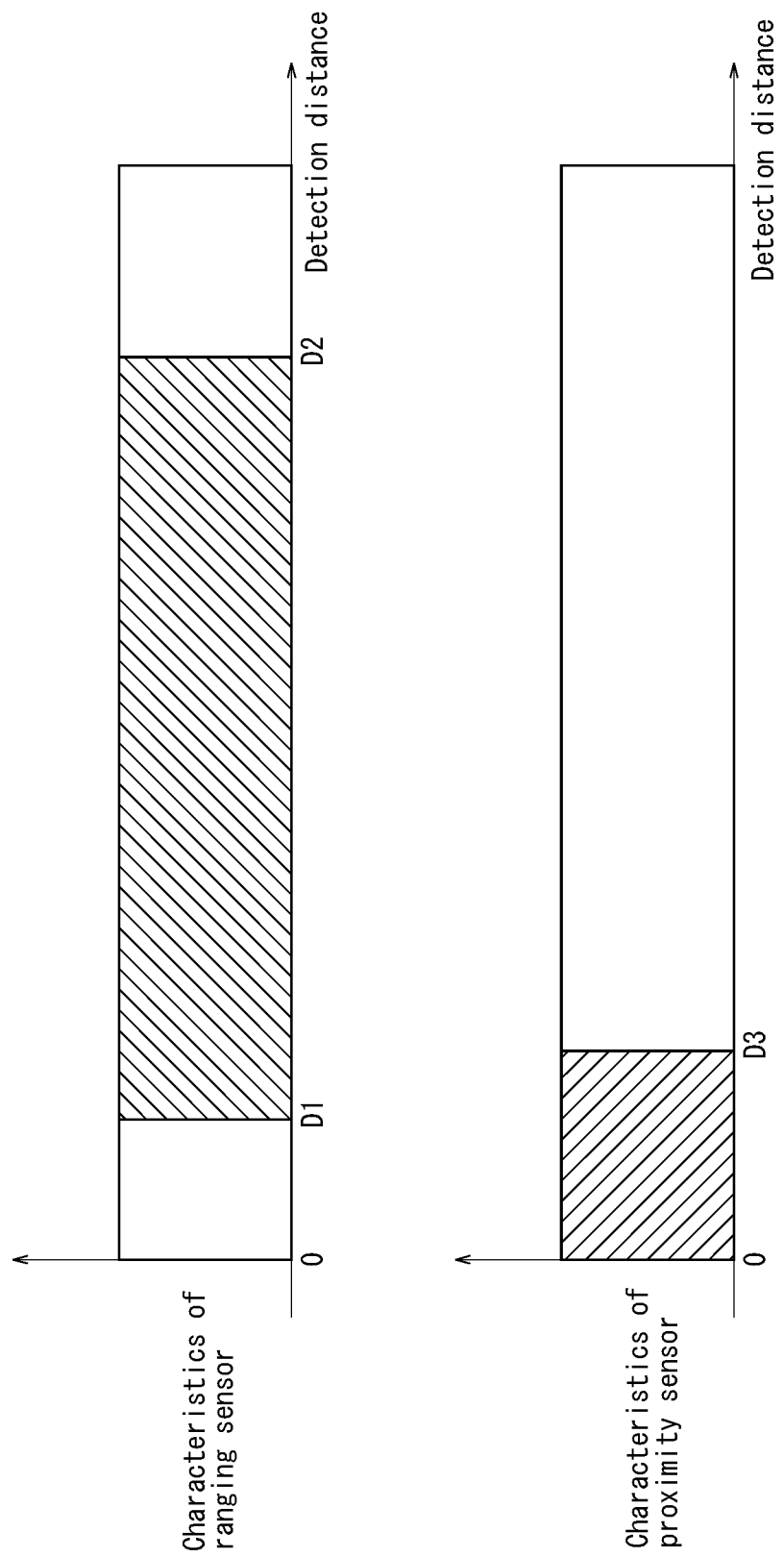
FIG. 11 schematically illustrates the detection distance of a proximity sensor and a ranging sensor.

Here, the characteristics of the distance at which the proximity sensor 5 and the ranging sensor 18 in the electronic device 1 can detect an object are described. FIG. 11 schematically illustrates the detection distance of the proximity sensor 5 and the ranging sensor 18. The upper tier of FIG. 11 illustrates the detection distance of the ranging sensor 18, and the lower tier of FIG. 11 illustrates the detection distance of the proximity sensor 5. In FIG. 11, the position of the sensor is 0, and the hatching indicates the distance at which each sensor is capable of detection.

As illustrated in the upper tier of FIG. 11, the ranging sensor 18 configured by the ToF sensor can detect an object at a position equal to or greater than distance D1 and less than distance D2, where D1<D2. This means that the ranging sensor 18 cannot detect an object that is at a position equal to or greater than distance 0 and less than distance D1. The reason is that the front side of the ToF sensor is covered by cover glass that reflects infrared light irradiated from the ToF sensor. At a distance of less than D1, it is therefore impossible to distinguish between light reflected by the object and light reflected by the cover glass. The ranging sensor 18 also cannot detect an object that is at a position equal to or greater than distance D2. This is because the ToF sensor cannot receive reflected light from a distance equal to or greater than D2. The ranging sensor 18 can detect an object that is at a position equal to or greater than distance D1 and less than distance D2 by the above-described principle. Accordingly, the ranging sensor 18 can detect a gesture performed by the user at a position equal to or greater than distance D1 and less than distance D2.

As illustrated in the lower tier of FIG. 11, the proximity sensor 5 can detect an object at a position equal to or greater than distance 0 and less than distance D3. In other words, the proximity sensor 5 cannot detect an object that is at a position equal to or greater than distance D3. The reason is that if the object is the distance D3 or father away, then the output of the proximity sensor illustrated in FIG. 8, for example, is less than the threshold A. The proximity sensor 5 can detect an object that is at a position equal to or greater than distance 0 and less than distance D3 by the above-described principle. Accordingly, the proximity sensor 5 can detect a gesture performed by the user at a position that is less than distance D3 away.

The electronic device 1 can use the proximity sensor 5 and the ranging sensor 18 so that the relationship between the distances at which the proximity sensor 5 and the ranging sensor 18 are capable of detection becomes D1<D3<D2. In this case, both the proximity sensor 5 and the ranging sensor 18 can detect an object that is at a position equal to or greater than distance D1 and less than distance D3, as illustrated in FIG. 11. In other words, the distances at which each of the proximity sensor 5 and the ranging sensor 18 is capable of detection partially overlap. The electronic device 1 can therefore continuously detect an object that is at a position in a range from distance 0 to distance D2, with no undetectable gaps, using the proximity sensor 5 and the ranging sensor 18. In the present embodiment, the distances at which the proximity sensor 5 and the ranging sensor 18 are capable of detection are described below as having the relationship illustrated in FIG. 11. Specifically, the relationship D1<D3<D2 holds in the present embodiment.

Next, processing by the controller 10 of the electronic device 1 to detect a gesture is described. First control and second control are described in the present disclosure. The controller 10 of the electronic device 1 may execute either the first control or the second control as processing to detect a gesture by the user.

(First Control)

Figure 12:
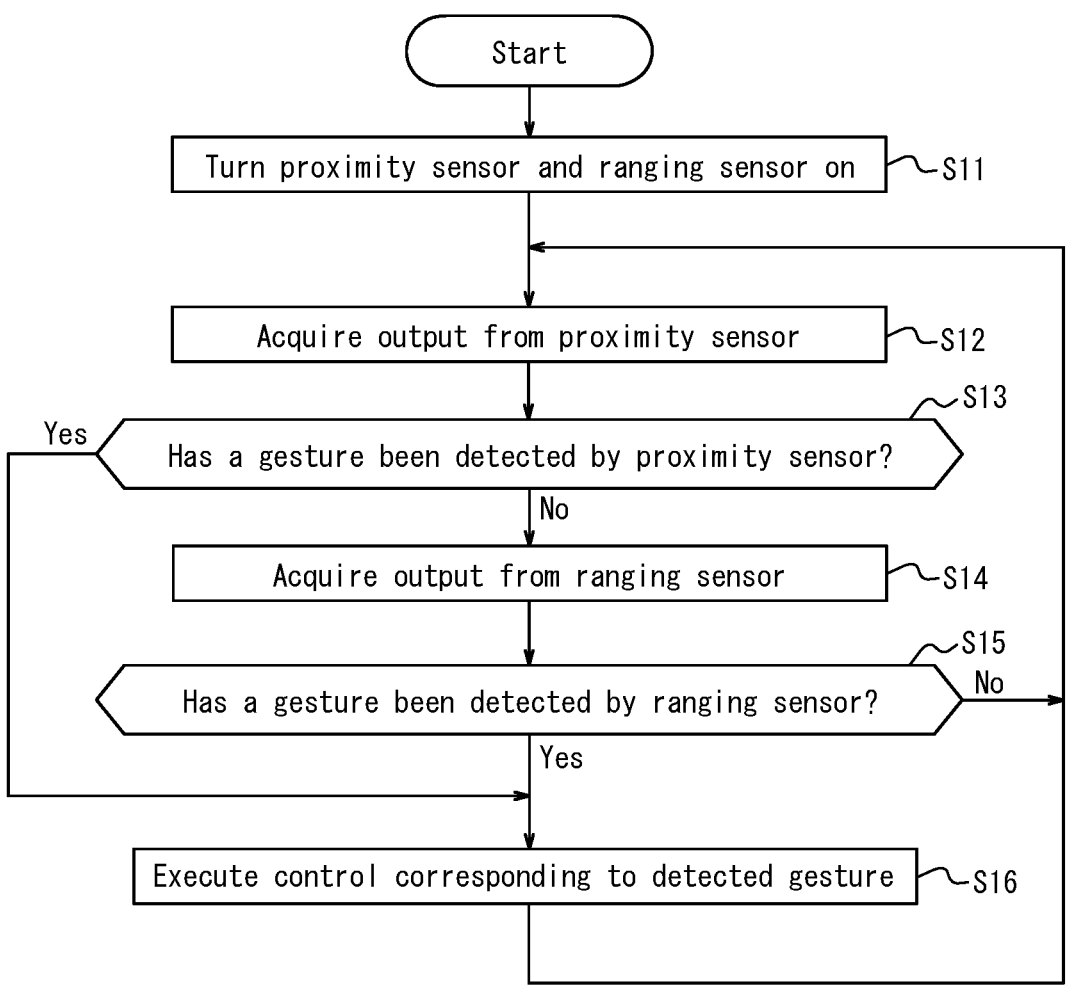
FIG. 12 is a flowchart illustrating an example of processing due to control executed by a controller of an electronic device.

FIG. 12 is a flowchart illustrating an example of processing executed by the controller 10 of the electronic device 1 during the first control. The processing flow in FIG. 12 may be executed when, for example, the user launches a function on the electronic device 1 to detect a gesture. The processing flow in FIG. 12 may be executed when, for example, the user sets the electronic device 1 to kitchen mode. At the point when the processing flow in FIG. 12 begins, the proximity sensor 5 and the ranging sensor 18 are both off, i.e. in a non-activated state.

The controller 10 turns the proximity sensor 5 and the ranging sensor 18 both on (step S11). Gesture detection by each of the proximity sensor 5 and the ranging sensor 18 thus begins.

The controller 10 detects a gesture based on output from the proximity sensor 5 and the ranging sensor 18.

Specifically, the controller 10 acquires output from the proximity sensor 5 (step S12).

The controller 10 judges whether a gesture has been detected by the proximity sensor 5 based on the output of the proximity sensor 5 acquired in step S12 (step S13). The controller 10 can, for example, judge that a gesture has been detected by the proximity sensor 5 when a gesture is performed at a position less than distance D3 away and can judge that a gesture has not been detected by the proximity sensor 5 when a gesture is performed at a position equal to or greater than distance D3 away.

When it is judged that a gesture has been detected by the proximity sensor 5 (step S13: Yes), the controller 10 executes control corresponding to the detected gesture (step S16). The controller 10 may, for example, scroll the screen on the touchscreen display 2 in response to the detected gesture.

When it is judged that a gesture has not been detected by the proximity sensor 5 (step S13: No), the controller 10 acquires output from the ranging sensor 18 (step S14).

The controller 10 judges whether a gesture has been detected by the ranging sensor 18 based on the output of the ranging sensor 18 acquired in step S14 (step S15). The controller 10 can, for example, judge that a gesture has been detected by the ranging sensor 18 when a gesture is performed at a position equal to or greater than distance D1 and less than distance D2 away and can judge that a gesture has not been detected by the ranging sensor 18 when a gesture is performed at a position less than distance D1 or equal to or greater than distance D2 away.

When it is judged that a gesture has been detected by the ranging sensor 18 (step S15: Yes), the controller 10 executes control corresponding to the detected gesture (step S16).

Conversely, when it is judged that a gesture has not been detected by the ranging sensor 18 (step S15: No), the controller 10 transitions to step S12.

After executing control corresponding to the gesture in step S16, the controller 10 may transition to step S12 and repeat steps S12 to S16. The controller 10 may suspend the processing flow in FIG. 12 when, for example, the user inputs an operation to suspend detection of gestures in the electronic device 1.

In the processing flow described in FIG. 12, the controller 10 judges whether a gesture has been detected by the proximity sensor 5 and then judges whether a gesture has been detected by the ranging sensor 18. However, the controller 10 may, for example, judge whether a gesture has been detected by the ranging sensor 18 and then judge whether a gesture has been detected by the proximity sensor 5. The controller 10 may also simultaneously execute the process to judge whether a gesture has been detected by the proximity sensor 5 and the process to judge whether a gesture has been detected by the ranging sensor 18.

By detecting a gesture based on output from the proximity sensor 5 and the ranging sensor 18 in this way, the controller 10 can detect a gesture performed at the detection distance of either the proximity sensor 5 or the ranging sensor 18. In other words, the controller 10 can detect a gesture as long as the gesture is performed within the detection distance of either the proximity sensor 5 or the ranging sensor 18. As compared to a known electronic device that detects gestures only with a proximity sensor, the electronic device 1 can also detect a gesture performed at the detection distance of the ranging sensor 18 and can therefore extend the gesture detection distance. In other words, the electronic device 1 can detect more distant gestures than a known electronic device can. The electronic device 1 can therefore improve the detection accuracy of more distant gestures.

For example, suppose that the user is temporarily away from the electronic device 1 while the electronic device 1 is still in kitchen mode. Further suppose that the electronic device 1 uses a timer function, installed as one of the functions in kitchen mode, to notify the user with sound or the like that a set time has elapsed. In the case of a known electronic device that detects gestures only with a proximity sensor, the user would need to return to near the electronic device to perform a gesture to stop the sound. The electronic device 1 of the present disclosure, however, has an extended gesture detection distance, allowing the user to stop the sound by performing a gesture from farther away than in the case of a known electronic device. Therefore, depending on the position of the user, the user can stop the sound by performing a gesture from the user's position without moving towards the electronic device 1.

(Second Control)

In the first control, the case of both the proximity sensor 5 and the ranging sensor 18 being activated was described. In the second control, the controller 10 activates only one of the proximity sensor 5 and the ranging sensor 18. For example, the controller 10 may perform control to switch the sensor being operated between the proximity sensor 5 and the ranging sensor 18 in accordance with the distance between the object to be detected and the electronic device 1. In this case, the controller 10 can detect a gesture based on output from the sensor being operated.

FIG. 13 is a flowchart illustrating an example of processing executed by the controller 10 of the electronic device 1 during the second control. The processing flow in FIG. 13 may be executed when, for example, the user launches a function on the electronic device 1 to detect a gesture. The processing flow in FIG. 13 may be executed when, for example, the user sets the electronic device 1 to kitchen mode. At the point when the processing flow in FIG. 13 begins, the proximity sensor 5 and the ranging sensor 18 are both off, i.e. in a non-activated state.

The controller 10 turns the proximity sensor 5 on (step S21). The proximity sensor 5 thus starts to operate, and gesture detection by the proximity sensor 5 begins.

The controller 10 acquires output from the proximity sensor 5 (step S22).

The controller 10 judges whether a gesture has been detected by the proximity sensor 5 based on the output of the proximity sensor 5 acquired in step S22 (step S23). The controller 10 can, for example, judge that a gesture has been detected by the proximity sensor 5 when a gesture is performed at a position less than distance D3 away and can judge that a gesture has not been detected by the proximity sensor 5 when a gesture is performed at a position equal to or greater than distance D3 away.

When it is judged that a gesture has been detected by the proximity sensor 5 (step S23: Yes), the controller 10 executes control corresponding to the detected gesture (step S24). The controller 10 then transitions to step S22 and repeats the processing from step S22 to step S24 as long as a gesture is being detected by the proximity sensor 5.

When it is judged that a gesture has not been detected by the proximity sensor 5 (step S23: No), the controller 10 turns the proximity sensor 5 off (step S25).

The controller 10 then turns the ranging sensor 18 on (step S26). That is, when it is judged in step S23 that a gesture has not been detected by the proximity sensor 5, the controller 10 switches the sensor being operated from the proximity sensor 5 to the ranging sensor 18. The ranging sensor 18 thus starts to operate, and gesture detection by the ranging sensor 18 begins.

The controller 10 acquires output from the ranging sensor 18 (step S27).

The controller 10 judges whether a gesture has been detected by the ranging sensor 18 based on the output of the ranging sensor 18 acquired in step S27 (step S28). The controller 10 can, for example, judge that a gesture has been detected by the ranging sensor 18 when a gesture is performed at a position equal to or greater than distance D1 and less than distance D2 away and can judge that a gesture has not been detected by the ranging sensor 18 when a gesture is performed at a position less than distance D1 or equal to or greater than distance D2 away.

When a gesture is no longer detected by the proximity sensor 5, the position at which a gesture is performed might have become a position equal to or greater than distance D3 away. When a gesture is no longer detected by the proximity sensor 5, the controller 10 therefore turns on the ranging sensor 18 to change the gesture detection distance to a range equal to or greater than distance D1 and less than distance D2. Gestures that could no longer be detected with the proximity sensor 5 can thereby be detected with the ranging sensor 18.

When it is judged that a gesture has been detected by the ranging sensor 18 (step S28: Yes), the controller 10 executes control corresponding to the detected gesture (step S29). The controller 10 then transitions to step S27 and repeats the processing from step S27 to step S29 as long as a gesture is being detected by the ranging sensor 18.

When it is judged that a gesture has not been detected by the ranging sensor 18 (step S28: No), the controller 10 turns the ranging sensor 18 off (step S30). The controller 10 then transitions to step S21 and turns the proximity sensor 5 on again. That is, when it is judged in step S28 that a gesture has not been detected by the ranging sensor 18, the controller 10 switches the sensor being operated from the ranging sensor 18 to the proximity sensor 5. The proximity sensor 5 thus starts to operate again, and gesture detection by the proximity sensor 5 begins.

When a gesture is no longer detected by the ranging sensor 18, the position at which a gesture is performed might have become a position less than distance D1 or equal to or greater than distance D2 away. When a gesture is performed at a position less than distance D1 away and is no longer detectable with the ranging sensor 18, the controller 10 can detect the gesture with the proximity sensor 5 by turning on the proximity sensor 5 to change the gesture detection distance.

The controller 10 may suspend the processing flow in FIG. 12 when, for example, the user inputs an operation to suspend detection of gestures in the electronic device 1.

As compared to a known electronic device that detects gestures only with a proximity sensor, the second control can extend the gesture detection distance, like the first control. Furthermore, the controller 10 turns one of the proximity sensor 5 and the ranging sensor 18 on and turns the other off with the second control, thereby allowing a reduction in power consumption.

Other Embodiments

It is to be noted that various changes and modifications to the matter described above with reference to the drawings and embodiments will be apparent to those skilled in the art based on the present disclosure. Therefore, such changes and modifications are to be understood as included within the scope of the present disclosure. For example, the functions and the like included in the various components, steps, and the like may be reordered in any logically consistent way. Furthermore, components, steps, and the like may be combined into one or divided.

For example, in the above embodiment, the controller 10 has been described as detecting a gesture based on output from the proximity sensor 5 and the ranging sensor 18. The controller 10 can, however, estimate the distance between the electronic device 1 and the user, for example, based on output of the proximity sensor 5 and the ranging sensor 18. The controller 10 can, for example, estimate the distance to a user in front of the electronic device 1 when the proximity sensor 5 and the ranging sensor 18 are located at the front side of the electronic device 1, as in the above embodiment. In other words, the controller 10 can estimate the distance between the electronic device 1 and the user by calculating the distance of the user from the electronic device 1 based on the output of the ranging sensor 18.

When estimating the distance between the electronic device 1 and the user, the controller 10 may turn the display of the touchscreen display 2 on or off in accordance with the estimated distance. For example, when the user is estimated to be equal to or greater than a predetermined distance away, the controller 10 may turn off the display of the touchscreen display 2. When it is judged that the user has approached to a position less than the predetermined distance away from the electronic device 1, the controller 10 may turn on the display of the touchscreen display 2. With this control, the controller 10 can turn the display of the touchscreen display 2 on when the user approaches the electronic device 1 and is at a position where the display of the electronic device 1 is visible and can turn the display of the touchscreen display 2 off when the user has moved away from the electronic device 1. The controller 10 can thereby reduce power consumption of the electronic device 1.

In the above embodiment, gestures have been described as being detected by the proximity sensor 5 and the ranging sensor 18, but gestures do not necessarily have to be detected by the proximity sensor 5 and the ranging sensor 18. Gestures may be detected by any non-contact sensor that can detect user gestures with any appropriate non-contact method. Examples of non-contact sensors include the camera 13 and the illuminance sensor 4.

Much of the subject matter of the present disclosure is described as a series of operations executed by a computer system and other hardware that can execute program instructions. Examples of the computer system and other hardware include a general-purpose computer, a personal computer (PC), a dedicated computer, a workstation, a personal communications system (PCS), a mobile (cellular) phone, a mobile phone with a data processing function, an RFID receiver, a game device, an electronic notepad, a laptop computer, a GPS receiver, and other programmable data processing apparatuses. It should be noted that in each embodiment, various operations or control methods are executed by a dedicated circuit (for example, individual logical gates interconnected in order to execute a particular function) implemented by program instructions (software), or by a logical block and/or program module or the like executed by one or more processors. The one or more processors that execute a logical block and/or program module or the like include, for example, one or more of a microprocessor, CPU, application specific integrated circuit (ASIC), digital signal processor (DSP), programmable logic device (PLD), field-programmable gate array (FPGA), processor, controller, microcontroller, microprocessor, electronic device, other apparatus designed to be capable of executing the functions disclosed here, and/or a combination of any of the above. The embodiments disclosed here are, for example, implemented by hardware, software, firmware, middleware, microcode, or a combination of any of these. The instructions may be program code or a code segment for executing the necessary tasks. The instructions may be stored on a machine-readable, non-transitory storage medium or other medium. The code segment may indicate a combination of any of the following: procedures, functions, subprograms, programs, routines, subroutines, modules, software packages, classes, instructions, data structures, or program statements. The code segment may transmit and/or receive information, data arguments, variables, or memory content to or from another code segment or hardware circuit in order for the code segment to connect to another code segment or hardware circuit.

The storage 9 used here may also be configured as a computer-readable, tangible carrier (medium) in any of the categories of solid-state memory, magnetic disks, and optical discs. Data structures or an appropriate set of computer instructions, such as program modules, for causing a processor to execute the techniques disclosed herein are stored on these media. Examples of computer-readable media include an electrical connection with one or more wires, a magnetic disk storage medium, a magnetic cassette, a magnetic tape, or other magnetic or optical storage medium, such as a compact disc (CD), laser Disc®, digital versatile disc (DVD®), Floppy® disk, and Blu-ray Disc® (laser disc, DVD, floppy, and Blu-ray disc are registered trademarks in Japan, other countries, or both). Further examples include a portable computer disk, random access memory (RAM), read-only memory (ROM), rewritable programmable ROM such as erasable programmable read-only memory (EPROM), electrically erasable programmable read-only memory (EEPROM), or flash memory, another tangible storage medium that can store information, or a combination of any of these. The memory may be provided internal and/or external to a processor or processing unit. As used in the present disclosure, the term "memory" refers to all types of long-term storage, short-term storage, and volatile, non-volatile, or other memory. In other words, the "memory" is not limited to a particular type and/or number. The type of medium on which information is stored is not limited, either.

REFERENCE SIGNS LIST 1, 101 Electronic device
2 Touchscreen display
2A Display
2B Touchscreen
3 Operation interface
4 Illuminance sensor
5 Proximity sensor
6 Communication interface
7 Receiver
8 Microphone
9 Storage
9A Control program
9Z Setting data
10 Controller
11 Speaker
12, 13 Camera
14 Connector
15 Acceleration sensor
16 Direction sensor
17 Gyroscope
18 Ranging Sensor
18a Light emitter
18b Light receiver
121 Protective sheet
122 Adhesive layer
123 Strengthened glass
180 Infrared LED used as light source
181 Lens
SU, SR, SD, SL Photodiode

The invention claimed is:

1. An electronic device comprising:
a proximity sensor;
a ranging sensor; and
a controller configured to switch a sensor to be operated between the proximity sensor and the ranging sensor in accordance with a distance between an object to be detected and the electronic device, wherein
distances at which the proximity sensor and the ranging sensor are capable of detecting the object to be detected are different,
the controller is configured to detect the object by the ranging sensor in a range where the object is detected by the proximity sensor through a protective sheet which affects a value of the range in which the proximity sensor detects the object,
the controller is further configured to estimate a distance from a user to the electronic device based on a distance to the user detected by the ranging sensor, and to turn a display of the electronic device on or off based on the estimated distance, and
the controller is further configured to perform at least one of the following:
switch the proximity sensor from an on state to an off state, and switch the ranging sensor from an off state to an on state, in response to the object being no longer detected by the proximity sensor; and
switch the ranging sensor from an on state to an off state, and switch the proximity sensor from an off state to an on state, in response to the object being no longer detected by the ranging sensor.

2. The electronic device of claim 1, wherein the distances at which the proximity sensor and the ranging sensor are capable of detecting the object to be detected partially overlap.

3. The electronic device of claim 1, wherein the controller is configured to switch the proximity sensor from the on state to the off state, and switch the ranging sensor from the off state to the on state, in response to the object being no longer detected by the proximity sensor.

4. The electronic device of claim 1, wherein the controller is configured to switch the ranging sensor from the on state to the off state, and switch the proximity sensor from the off state to the on state, in response to the object being no longer detected by the ranging sensor.

5. The electronic device of claim 1, wherein
the proximity sensor senses an object at a distance equal to or greater than zero from a surface of a touch screen of the electronic device and less than a first distance from the surface, and the ranging sensor senses an object at a position equal to or greater than a second distance from the surface, which is smaller than the first distance and less than a third distance from the surface, which is greater than the first distance.

6. An electronic device comprising:
a proximity sensor;
a ranging sensor; and a controller configured to detect a gesture based on output of the proximity sensor and the ranging sensor, wherein distances at which the proximity sensor and the ranging sensor are capable of detecting the object to be detected are different, the controller is configured to detect the object by the ranging sensor in a range where the object is detected by the proximity sensor through a protective sheet which affects a value of the range in which the proximity sensor detects the object, the controller is further configured to estimate a distance from a user to the electronic device based on a distance to the user detected by the ranging sensor, and to turn a display of the electronic device on or off based on the estimated distance, and the controller is further configured to perform at least one of the following:
  switch the proximity sensor from an on state to an off state, and switch the ranging sensor from an off state to an on state, in response to the object being no longer detected by the proximity sensor; and
  switch the ranging sensor from an on state to an off state, and switch the proximity sensor from an off state to an on state, in response to the object being no longer detected by the ranging sensor.

7. The electronic device of claim 6, wherein the distances at which the proximity sensor and the ranging sensor are capable of detecting the object to be detected partially overlap.

8. The electronic device of claim 6, wherein the controller is configured to detect the gesture based on output of whichever of the proximity sensor and the ranging sensor is detecting the object to be detected.

9. The electronic device of claim 6, wherein the controller is configured to switch the proximity sensor from the on state to the off state, and switch the ranging sensor from the off state to the on state, in response to the object being no longer detected by the proximity sensor.

10. The electronic device of claim 6, wherein the controller is configured to switch the ranging sensor from the on state to the off state, and switch the proximity sensor from the off state to the on state, in response to the object being no longer detected by the ranging sensor.

11. The electronic device of claim 6, wherein
the proximity sensor senses an object at a distance equal to or greater than zero from a surface of a touch screen of the electronic device and less than a first distance from the surface, and the ranging sensor senses an object at a position equal to or greater than a second distance from the surface, which is smaller than the first distance and less than a third distance from the surface, which is greater than the first distance.

12. A control method for an electronic device comprising a proximity sensor, a ranging sensor, and a controller, the control method comprising:
  detecting, using the controller, a gesture based on output of the proximity sensor and the ranging sensor, such that distances at which the proximity sensor and the ranging sensor are capable of detecting the object to be detected are different,
  detecting the object, using the controller, by the ranging sensor in a range where the object is detected by the proximity sensor through a protective sheet which affects a value of the range in which the proximity sensor detects the object,
  estimating, using the controller, a distance from a user to the electronic device based on a distance to the user detected by the ranging sensor, and turning a display of the electronic device on or off based on the estimated distance, and
  performing, using the controller, at least one of the following:
    switching the proximity sensor from an on state to an off state, and switching the ranging sensor from an off state to an on state, in response to the object being no longer detected by the proximity sensor; and
    switching the ranging sensor from an on state to an off state, and switching the proximity sensor from an off state to an on state, in response to the object being no longer detected by the ranging sensor.

13. The control method of claim 12, wherein the performing uses the controller is to switch the proximity sensor from the on state to the off state, and switch the ranging sensor from the off state to the on state, in response to the object being no longer detected by the proximity sensor.

14. The control method of claim 12, wherein the performing uses the controller to switch the ranging sensor from the on state to the off state, and switch the proximity sensor from the off state to the on state, in response to the object being no longer detected by the ranging sensor.

15. The control method of claim 12, wherein
the proximity sensor senses an object at a distance equal to or greater than zero from a surface of a touch screen of the electronic device and less than a first distance from the surface, and the ranging sensor senses an object at a position equal to or greater than a second distance from the surface, which is smaller than the first distance and less than a third distance from the surface, which is greater than the first distance.

* * * * *